United States Patent [19]

Sakakibara

[11] Patent Number: 4,901,104
[45] Date of Patent: Feb. 13, 1990

[54] IMAGE RECORDING APPARATUS
[75] Inventor: Kenji Sakakibara, Ichinomiya, Japan
[73] Assignee: Brother Kogyo Kabushiki Kaisha, Japan
[21] Appl. No.: 196,977
[22] Filed: May 20, 1988
[30] Foreign Application Priority Data
May 25, 1987 [JP] Japan .................................. 62-127482
[51] Int. Cl.$^4$ ...................... G03B 27/37; G03B 27/52; G03B 27/72
[52] U.S. Cl. ......................................... 355/32; 355/27; 355/71; 430/138
[58] Field of Search ....................... 355/27, 32, 35, 71; 346/107 R, 108; 430/138

[56] References Cited

U.S. PATENT DOCUMENTS 2,740,323  4/1956  Borth et al. ............................ 355/35
3,335,636  8/1967  Atkinson ............................ 355/71 X Primary Examiner—Richard A. Wintercorn
Attorney, Agent, or Firm—Kane, Dalsimer, Sullivan, Kurucz, Levy, Eisele and Richard

[57] ABSTRACT

In an image recording apparatus, a halftone screen having its light transmittance varying regularly is arranged on an optical path extending between a light source and a photo-sensitive recording medium. The halftone screen is movable along the optical path between an operative position where a screening effect of the halftone screen is validated and an inoperative position where the screening effect of the halftone screen is invalidated. A controller is provided for controlling the position of the halftone screen in such a manner that when an image on an original is of a continuous tone, the halftone screen is moved to the operative position, while when the image on the original is of a dot tone, the halftone screen is moved to the inoperative position.

12 Claims, 9 Drawing Sheets

INTENSITY OF LIGHT TRANSMITTED THROUGH FILTER SECTION FOR CYAN

FIG. 6b

EXPOSURE DISTRIBUTION ON PHOTO AND PRESSURE SENSITIVE RECORDING SHEET

FIG. 7

COLOR-DEVELOPMENT CONCENTRATION DISTRIBUTION FOR RED

IMAGE RECORDING APPARATUS

BACKGROUND OF THE INVENTION

This invention relates to an image recording apparatus for recording an image onto a photo-sensitive recording medium in accordance with given image information.

An image recording apparatus of the kind referred to above is conventionally known, in which a light is applied to an original, and the light reflected by or transmitted through the original is caused to pass through an optical system including a reflecting mirror, an optical filter, lenses and the like. A photo-sensitive recording medium is exposed to the light by the optical system, so that a latent image corresponding to an image on the original is formed on the photo-sensitive recording medium.

Figure 13:
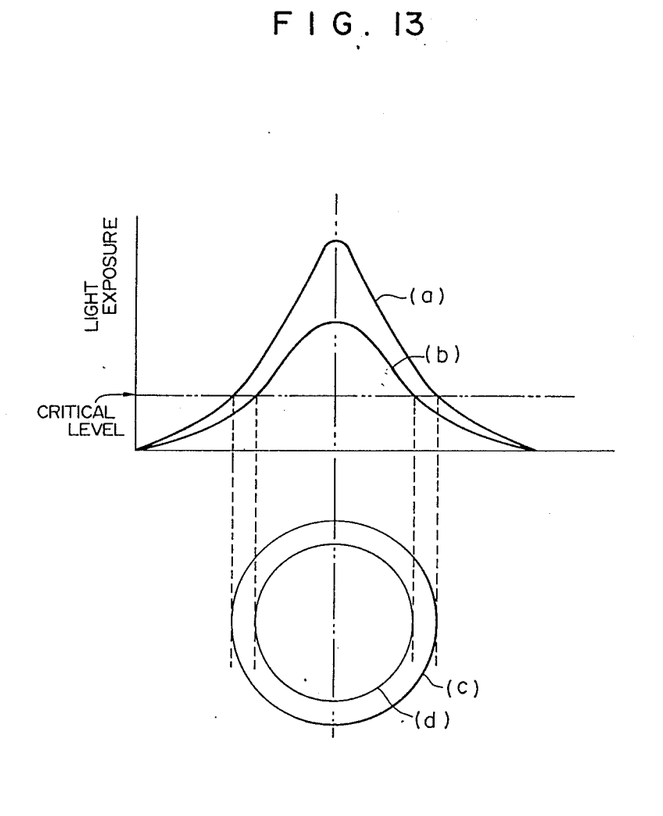
FIG. 13 is a view for explanation of a manner in which dots are formed on the photo-sensitive recording medium when a halftone screen is employed.

In the above image recording apparatus, when the image on the original is of a so-called continuous tone in which the lights and darks of the image varies continuously like photographs or pictures, the photo-sensitive recording medium high in gamma value is employed in which a color-development concentration changes abruptly with respect to a light exposure so that a contrasty image can be recorded on the photo-sensitive recording medium. In this case, a halftone screen having a dot pattern is arranged on an optical path extending between the original and the photo-sensitive recording medium, to expose the recording medium to the light having passed through the halftone screen. Such arrangement is advantageous in that the gradation reproducibility of the photo-sensitive recording medium can be improved. Specifically, when the halftone screen of, for example, a cross-stripe pattern is employed, the exposure of the light transmitted through one of transparent portions of the halftone screen and arriving at the photo-sensitive recording medium varies depending upon the darks and lights of the image on the original as indicated respectively by (a) and (b) in FIG. 13. As the exposure of the light arriving at the photo-sensitive recording medium exceeds a critical level, a portion on the recording medium, at which the light arrives, is developed with a constant concentration so that the darks and lights of the image on the original are replaced respectively by a large spot and a small spot as indicated respectively by (c) and (d) in FIG. 13. In this manner, the difference between the darks and lights of the image on the original is expressed as an area gradation by the size and distribution density of dots. Thus, it is possible to improve the gradation reproducibility of the photo-sensitive recording medium.

According to the conventional apparatus described above, if the halftone screen is employed when the image on the original is of a continuous tone, the gradation of the image recorded on the photo-sensitive recording medium is improved. However, if the halftone screen is employed for the original in which the lights and darks of the image on the original are expressed by dots different in size from each other, interference between the dots of the image on the original and the halftone screen causes interference fringes or moire to be formed on the image recorded onto the photo-sensitive recording medium. This raises such a problem that the image recorded onto the recording medium becomes blurred.

SUMMARY OF THE INVENTION

It is therefore an object of this invention to provide an improved image recording apparatus capable of recording an image, which is clear and high in gradation, onto a photo-sensitive recording medium, regardless of the type of an original, that is, regardless of whether an image on the original is of a continuous tone or of a dot tone.

For the above purpose, according to the invention, there is provided an apparatus for recording an image on an original onto a photo-sensitive recording medium high in gamma value, which comprises:

light source means for emitting a light with which the original is illuminated, the light from the light source means passing along a predetermined optical path extending between the light source means and the photo-sensitive recording medium;

an optical system arranged on the predetermined optical path for exposing the photo-sensitive recording medium to the light from the original to form an image on the photo-sensitive recording medium, which image corresponds to the image on the original;

halftone screen means having its light transmittance varying regularly, the halftone screen means being arranged on the optical path for movement therealong between an operative position where a screening effect of the halftone screen means is validated and an inoperative position where the screening effect of the halftone screen means is invalidated;

moving means for moving the halftone screen means between the operative and inoperative positions; and control means for controlling the moving means in such a manner that when the image on the original is of a continuous tone, the moving means moves the halftone screen means to the operative position, while when the image on the original is of a dot tone, the moving means moves the halftone screen means to the inoperative position.

With the arrangement of the image recording apparatus according to the invention, it is possible to record, onto the photo-sensitive recording medium, an image which is always sharp and high in gradation, in accordance with the type of the image on the original.

DESCRIPTION OF THE EMBODIMENTS

Figure 1:
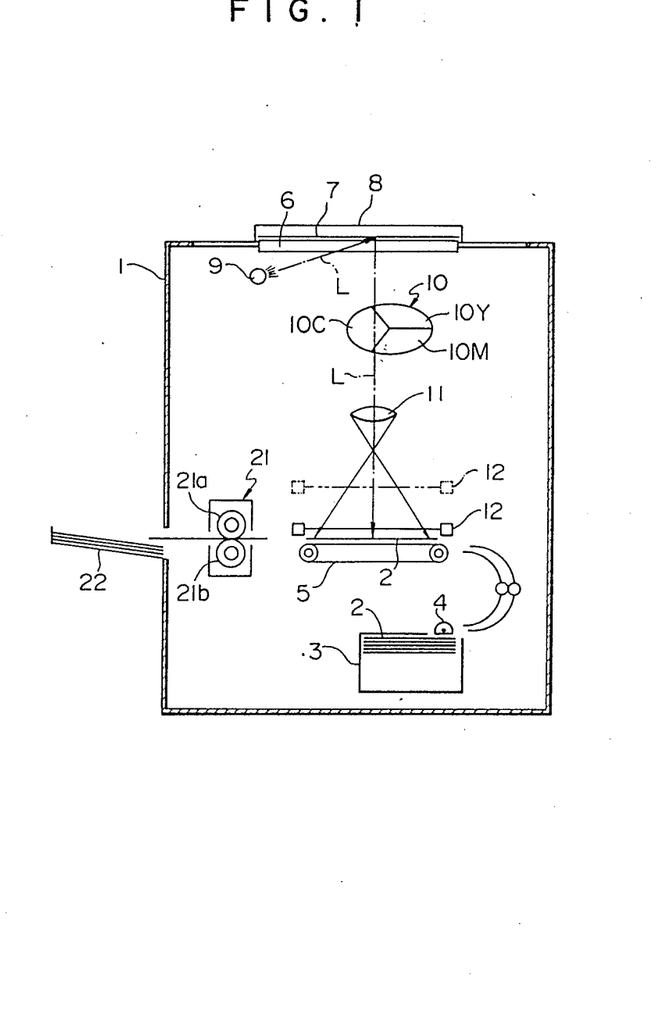
FIG. 1 is a schematic structural view of a color image recording apparatus embodying the invention.

Referring to FIG. 1, there is shown a color image recording apparatus embodying the invention, which comprises a body 1. A sheet feed cassette 3 is arranged at a lower location within the body 1. A stack of photo and pressure sensitive recording sheets 2 serving as a photo-sensitive recording medium is accommodated in the sheet feed cassette 3. The recording sheets 2 are adapted to be fed one by one by a sheet feed roller 4 and the like, onto an exposure platen 5 in the form of an endless belt.

Figure 2:
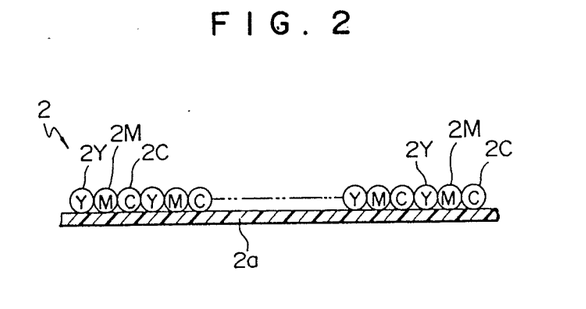
FIG. 2 is an exaggerated fragmental cross-sectional view of a photo and pressure sensitive recording sheet employed in the apparatus illustrated in FIG. 1.

As exaggeratedly shown in FIG. 2, the photo and pressure sensitive recording sheet 2 is composed of a sheet of substrate or carrier 2a and microcapsules coated on one side of the carrier 2a. The microcapsules include cyan microcapsules 2C primarily containing a cyan dye precursor, magenta microcapsules 2M primarily containing a magenta dye precursor, and yellow microcapsules 2Y primarily containing a yellow dye precursor. Each of the microcapsules 2C, 2M and 2Y also contains a photo-curable resin, a photo-sensitizer, a photo-polymerization initiator and the like. The one side of the carrier 2a is coated also with a developing agent which reacts with the dye precursors contained in the microcapsules 2C, 2M and 2Y to develop the color.

Figure 3:
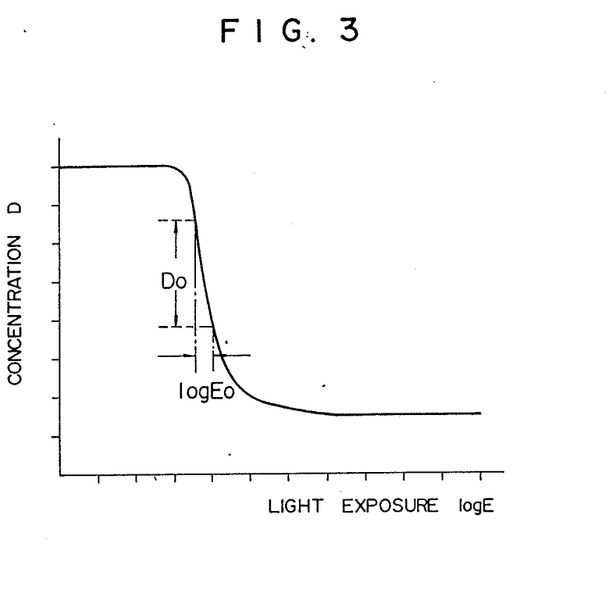
FIG. 3 is a graphical representation of a characteristic curve showing a change in color-development concentration with respect to an exposure of light to which the photo and pressure sensitive recording sheet illustrated in FIG. 2 is exposed.

FIG. 3 shows a characteristic curve or a so-called sensitometry curve representative of a change in color-development concentration with respect to the exposure of light to which the photo and pressure sensitive recording sheet 2 is exposed. It will be seen from FIG. 3 that the color-development concentration D varies abruptly with respect to the logarithmic value log E of the light exposure so that a gamma value ($\gamma = Do/\log Eo$) of the recording sheet 2 is high. Because of the high gamma value, it is possible to record a contrasty image in which a difference between the lights and darks of the image is brought out remarkably with respect to a change in the light exposure.

An original platen 6 formed of a transparent glass is mounted in the top wall of the body 1 for reciprocative movement in the horizontal plane in a known manner. An original cover 8 is provided for covering an original 7 resting on the original platen 6. Arranged below the original platen 6 is a lamp 9 serving as a light source emitting a light to scan a downwardly facing side of the original 7. The light from the lamp 9 is adapted to pass along a predetermined optical path L extending between the lamp 9 and the photo and pressure sensitive recording sheet 2 on the exposure platen 5. Arranged on the optical path L and between the original platen 6 and the recording sheet 2 on the exposure platen 5 is an optical system for exposing the recording sheet 2 to the light from the original 7. The optical system comprises a three-color separating filter 10 and an imaging lens 11. A halftone screen 12 is arranged on the optical path L and between the imaging lens 11 and the recording sheet 2 on the exposure platen 5.

In order to separate the light reflected from the original 7 into three primary colors, the three-color separating filter 10 is composed of three sectoral filter sections including a red sectoral filter section 10C for cyan through which only the light having wavelengths sensible by the cyan microcapsules 2C is allowed to pass, a green sectoral filter section 10M for magenta through which only the light having wavelengths sensible by the magenta microcapsules 2M is allowed to pass, and a blue sectoral filter section 10Y for yellow through which only the light having wavelengths sensible by the yellow microcapsules 2Y is allowed to pass.

Figure 4:
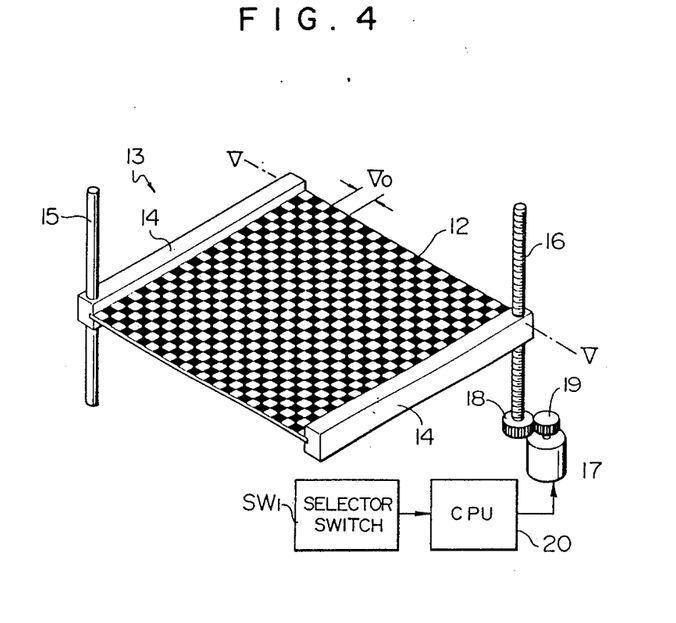
FIG. 4 is a perspective view of a halftone screen employed in the apparatus illustrated in FIG. 1, and a mechanism for adjusting a position of the halftone screen, with dots on the screen shown exaggeratedly.
Figure 5:
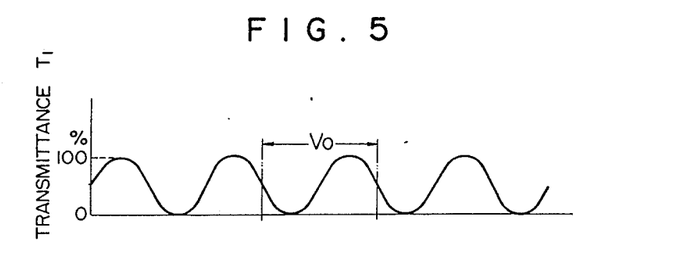
FIG. 5 is a graphical representation of a transmittance of the halftone screen along line V—V in FIG. 4, with the waveform shown exaggeratedly.

The halftone screen 12 employed in the illustrated embodiment is one generally called a contact screen. As shown in FIG. 4, the halftone screen 12 has a multiplicity of minute dots arranged in the form of a checkered pattern on a transparent resinous substrate at a distribution density of 175 per inch so that the lights and darks vary continuously. The halftone screen 12 has its light transmittance $T_1$ which varies continuously in the form of a sinusoidal curve as shown in FIG. 5. In the halftone screen 12 of this kind, it is known that a screening effect of the halftone screen 12 is validated when it is located in close relation to the photo and pressure sensitive recording sheet 2, but the screening effect is invalidated when the halftone screen 12 is located apart from the recording sheet 2. In order to facilitate understanding, the size of the dots in FIG. 4 and the size of the waveform indicative of the transmittance in FIG. 5 are shown exaggeratedly.

Referring to FIG. 4, moving means comprised of a position adjusting mechanism 13 is associated with the halftone screen 12 for moving the same along the optical path L between an operative position located in close relation to the photo and pressure sensitive recording sheet 2 on the exposure platen 5 as indicated by the solid line in FIG. 1, and an inoperative position located approximately 5 to 60 mm apart away from the recording sheet 2 as indicated by the phantom line in FIG. 1. In the operative position, the screening effect of the halftone screen 12 is validated, while in the inoperative position, the screening effect of the halftone screen 12 is invalidated.

Specifically, the position adjusting mechanism 13 comprises a pair of support members 14 and 14 which support respectively opposite side edges of the halftone screen 12. The support members 14 and 14 are mounted respectively on a vertical guide rod 15 and a vertical screw rod 16 for movement therealong. The screw rod 16 is drivingly connected to a stepping motor 17 through a pair of gear wheels 18 and 19. As the screw rod 16 is rotatively driven by the stepping motor 19, the support members 14 and 14 are moved together with the halftone screen 12 along the guide rod 15 and the screw rod 16. Control means associated with the stepping motor 17 comprises a CPU (central processing unit) 20 electrically connected to the stepping motor 17 and a selector switch $SW_1$ electrically connected to the CPU 20. The selector switch SW₁ is arranged on an operating panel (not shown) on the top wall of the body 1 and is selectively movable between a continuous-tone position and a dot-tone position. The arrangement is such that when the selector switch SW₁ is moved to the continuous-tone position, the CPU 20 controls the stepping motor 17 so as to move the halftone screen 12 to the operative position, while when the selector switch SW₁ is moved to the dot-tone position, the CPU 20 controls the stepping motor 17 so as to move the halftone screen 12 to the inoperative position.

With a selected one of the three sectoral filter sections 10C, 10M and 10Y of the color separating filter 10 located on the optical path L, and with the halftone screen 12 located at a selected one of the operative and inoperative positions, the original 7 on the original platen 6 is illuminated with the light from the lamp 9. The light reflected by the original 7 is caused to pass through the selected sectoral filter section of the color separating filter 10, the imaging lens 11 and the halftone screen 12. The photo and pressure sensitive recording sheet 2 on the exposure platen 5 is exposed to the light reflected from the original 7 in such a manner that only one of the three groups of microcapsules 2C, 2M and 2Y, corresponding to the selected filter sectoral section, is photo-cured by the light in accordance with the image on the original 7. Likewise, the remaining two filter sectoral sections are successively located on the optical path L, and the remaining two groups of microcapsules are successively photo-cured respectively by the lights transmitted through the respective remaining two sectoral filter sections. Thus, three color-decomposed latent images are formed on the recording sheet 2 in accordance with the image on the original 7.

A developing unit 21 for developing the latent images on the photo and pressure sensitive recording sheet 2 is arranged on the left-hand side of the exposure platen 5 as viewed in FIG. 1. The developing unit 21 comprises a pair of pressure-developing rollers 21a and 21b. The recording sheet 2 after having been subjected to the predetermined exposure processing on the exposure platen 5 is transported by running of the exposure platen 5 into the nip between the pair of pressure-developing rollers 21a and 21b of the developing unit 21. The recording sheet 2 is caused to pass under pressure through the nip between the pressure-developing rollers 21a and 21b to rupture the microcapsules 2C, 2M and 2Y remaining uncured, so that the dye precursors are squeezed out of the ruptured microcapsules. The dye precursors squeezed out of the ruptured microcapsules react with the developing agent to develop the latent images on the recording sheet 2. Thus, a color image is formed on the recording sheet 2. The recording sheet 2 having formed thereon the color image is transported by rotation of the pressure-developing rollers 21a and 21b and is discharged onto a tray 22.

The operation of the image recording apparatus constructed as above will be described with reference to FIGS. 1, 6a, 6b and 7.

Recording of an image onto the recording sheet 2 by the use of the original 7 whose image is of a continuous tone continuously varying in lights and darks like pictures, will first be described.

In this case, the selector switch SW₁ is moved to the continuous-tone position. In response to movement of the selector switch SW₁ to the continuous-tone position, the CPU 20 controls rotation of the stepping motor 17 so as to move the halftone screen 12 to the operative position indicated by the solid line in FIG. 1 where the halftone screen 12 is located in close relation to the recording sheet 2 on the exposure platen 5.

Figure 6A:
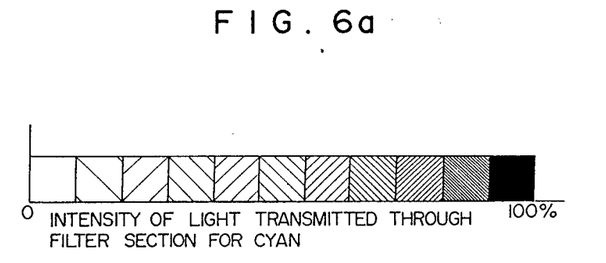
FIG. 6a is a view showing the intensity of a light transmitted through a sectoral filter section for cyan, of a color separating filter.
Figure 6B:
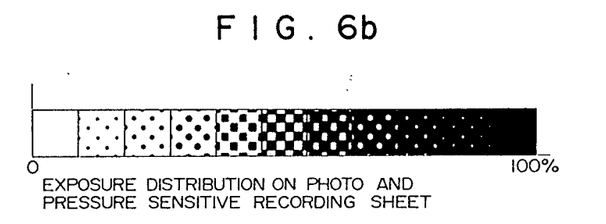
FIG. 6b is a view showing an exposure distribution on the photo and pressure sensitive recording sheet exposed to the light transmitted through the halftone screen.

With the halftone screen 12 located in the operative position, latent images corresponding respectively to cyan, magenta and yellow are formed, in the mentioned order, on the recording sheet 2 on the exposure platen 5. Specifically, the recording sheet 2 is fed from the sheet feed cassette 3 onto the exposure platen 5, and the three-color separating filter 10 is angularly moved successively in such a manner that the sectoral filter section 10C for cyan is first located on the optical path L, the sectoral filter section 10M for magenta is then located on the optical path L, and the sectoral filter section 10Y for yellow is lastly located on the optical path L. The lamp 9 is turned on each time one of the sectoral filter sections 10C, 10M and 10Y is located on the optical path L, to scan the downwardly facing side of the original 7. As a result, with the sectoral filter section 10C located on the optical path L, of the light reflected by the original 7, only the wavelengths sensible by the cyan microcapsules 2C are allowed to pass through the sectoral filter section 10C. The reflected light having the wavelengths having passed through the sectoral filter section 10C is applied to the photo and pressure sensitive recording sheet 2 on the exposure platen 5 through the imaging lens 11 and the halftone screen 12. That is, supposing that the reflected light having transmitted through the sectoral filter section 10C for cyan has the light intensity $L_1$ which varies continuously from 0 to 100% as shown in FIG. 6a, then the recording sheet 2 is exposed to the reflected light in such a fashion that passage of the reflected light through the halftone screen 12 causes a change in the light intensity $L_1$ to be replaced by dots different in size from each other. Specifically, as shown in FIG. 6b, when the intensity $L_1$ of the reflected light is low, exposed portions on the recording sheet 2 are represented by spots small in area. As the light intensity $L_1$ increases, the exposed portions on the recording sheet 2 are represented by spots gradually increasing in area. At an intermediate level of the light intensity $L_1$, the recording sheet 2 is exposed in such a fashion that exposed portions and unexposed portions form a checkered pattern. As the light intensity $L_1$ further increases, exposed portions increase in area, while unexposed portions are represented by spots small in area. In FIG. 6b, the exposed portions are indicated in a painted-out manner. Thus, only the cyan microcapsules 2C in the regions on the recording sheet 2 corresponding to the red portions of the image on the original 7 are photo-cured to form a latent image on the recording sheet 2.

Exposure of the magenta and yellow microcapsules 2M and 2Y is carried out in a manner similar to that described above. Specifically, with the sectoral filter section 10M for magenta or the sectoral filter section 10Y for yellow is selectively located on the optical path L, the lamp 9 is turned on to illuminate the original 7. Only the light having wavelengths sensible by the magenta microcapsules 2M or the yellow microcapsules 2Y is allowed to pass through the sectoral filter section, so that a latent image corresponding to green or blue portions of the image on the original 7 is formed in the form of dots on the recording sheet 2. These latent images corresponding respectively to red, green and blue are formed on the recording sheet 2 in a superposed fashion.

After formation of the latent images of the respective colors has been completed, the photo and pressure sensitive recording sheet 2 is caused to pass under pressure through the nip between the pressure-developing rollers 21a and 21b to rupture the microcapsules 2C, 2M and 2Y remaining uncured, so that the dye precursors are squeezed out of the ruptured microcapsules. The dye precursors squeezed out of the ruptured microcapsules react with the developing agent so that the color image is brought out on the recording sheet 2. The recording sheet 2 having formed thereon the color image is discharged onto the tray 22 by rotation of the pressure-developing rollers 21a and 21b.

Figure 7:
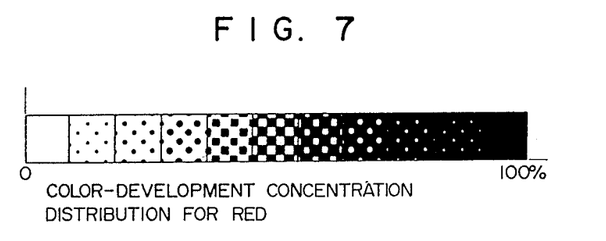
FIG. 7 is a view showing a color-development concentration.distribution of a red color on the photo and pressure sensitive recording sheet.

More specifically, only the cyan microcapsules 2C are photo-cured in the regions on the recording sheet 2 which are exposed to the red light from the original 7. In the regions, the magenta and yellow microcapsules 2M and 2Y are ruptured so that the magenta and yellow dye precursors react with the developing agent to produce the red color. As shown in FIG. 7, the lights and darks of the red color are represented by the size and distribution density of red dots. Likewise, in regions on the recording sheet 2 which are exposed to the green light from the original 7, only the magenta microcapsules 2M are photo-cured, and the yellow and cyan microcapsules 2Y and 2C are ruptured so that the yellow and cyan dye precursors react with the developing agent to produce the green color. On the other hand, in regions on the recording sheet 2 which are exposed to the blue color, only the yellow microcapsules 2Y are photo-cured, and the magenta and cyan microcapsules 2M and 2C are ruptured so that the magenta and cyan dye precursors react with the developing agent to produce the blue color. The lights and darks of each of the green and blue colors are represented by the size and distribution density of the dots.

Recording of an image onto the recording sheet 2 by the use of the original 7 whose image is of a dot tone in which the lights and darks of the image on the original 7 are represented by the size of dots, like printed manuscripts, will next be described.

In this case, the selector switch $SW_1$ is moved to the dot-tone position. In response to movement of the selector switch $SW_1$ to the dot-tone position, the stepping motor 17 is rotatively driven under the control of the CPU 20, to move the halftone screen 12 to the inoperative position spaced apart from the recording sheet 2, as indicated by the phantom line in FIG. 1.

With the halftone screen 12 located at the inoperative position, the recording sheet 2 is exposed successively to the lights transmitted respectively through the sectoral filter sections 10C, 10M and 10Y for cyan, magenta and yellow, in the mentioned order, in a manner like that for the aforesaid image of the continuous tone. Since the halftone screen 12 is located at the inoperative position, three color-decomposed latent images are formed on the recording sheet 2, in the form of dots corresponding to the dots of the image on the original 7.

The recording sheet 2 having formed thereon the latent images is caused to pass under pressure through the nip between the pressure-developing rollers 21a and 21b to develop the latent images, in a manner like that for the image of the continuous tone. Subsequently, the recording sheet 2 is discharged onto the tray 22.

In this manner, in the image recording apparatus embodying the invention, when the image on the original 7 is of a continuous tone, the halftone screen 12 arranged between the recording sheet 2 on the exposure platen 5 and the imaging lens 11 is located at the operative position close to the recording sheet 2 where the screening effect of the halftone screen 12 is validated, so that a sharp and high gradation image, in which a difference between the lights and darks is clear, can be recorded onto the recording sheet 2. On the other hand, when the image on the original 7 is of a dot tone, the halftone screen 12 is located at the inoperative position where the screening effect of the halftone screen 12 is invalidated, so that a sharp image can be recorded onto the recording sheet 2 without occurrence of interference fringes due to interference between the dots of the image on the original 7 and the halftone screen 12.

A modification of the image recording apparatus will be described with reference to FIGS. 8 through 10. In these figures, components and parts like or similar to those of the embodiment illustrated in FIGS. 1 through 7 are designated by like or similar reference numerals, and the detailed description of such like or similar components and parts will therefore be omitted to avoid repetition.

Figure 9:
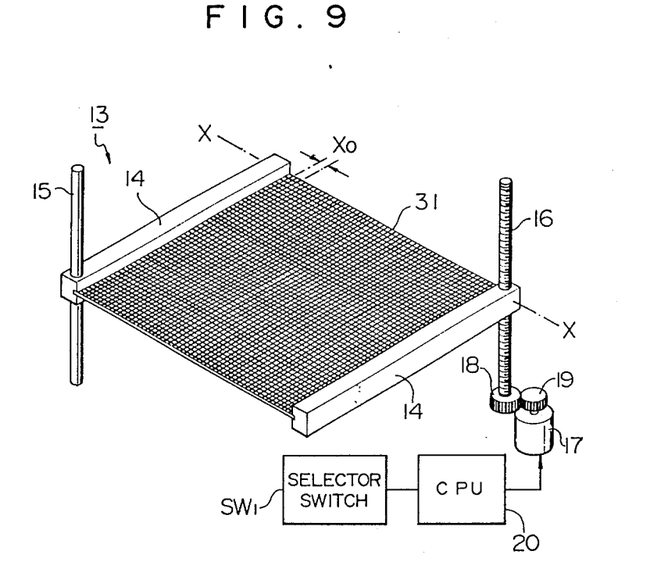
FIG. 9 is a perspective view of a halftone screen employed in modification illustrated in FIG. 8.

The modification is different from the previously mentioned embodiment in that a halftone screen 31 having a cross stripe pattern shown in FIG. 9 is employed in substitution for the halftone screen 12. The halftone screen 31 is one generally called a glass screen in which a first group of a multiplicity of black lines extending in parallel relation to each other are intersected at right angles with a second group of multiplicity of black lines extending in parallel relation to each other. The black lines in each of the first and second groups are equidistantly spaced from each other at intervals of 120 per inch. As shown in FIG. 10, the halftone screen 31 has its transmittance $T_2$ which varies continuously in the form of a rectangular wave. It is known in the halftone screen 31 of this kind that when the screen 31 is located a predetermined distance apart from the photo and pressure sensitive recording sheet 2 on the exposure platen 5, the screening effect of the screen 31 is validated, while when the screen 31 is located apart from the recording sheet 2 a distance longer than the predetermined distance, the screening effect of the screen 31 is invalidated.

Figure 8:
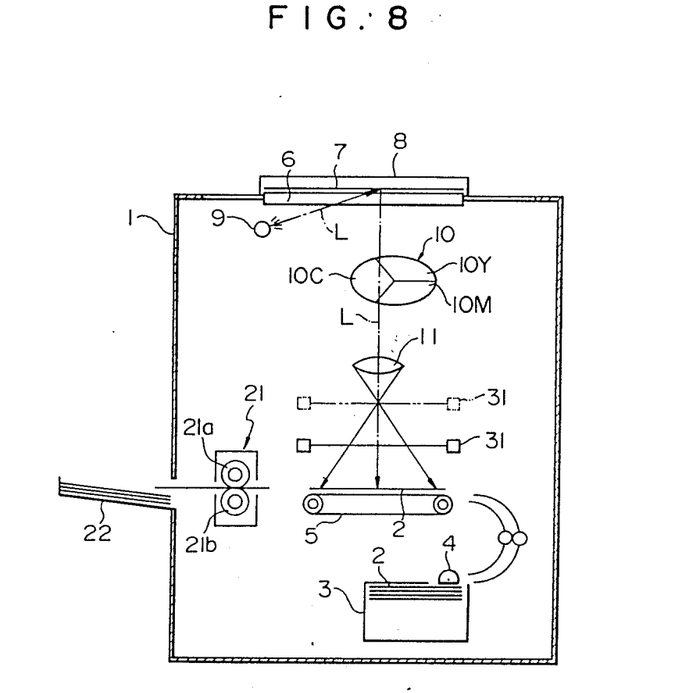
FIG. 8 is a schematic structural view of a modification of the apparatus.

Accordingly, when the halftone screen 31 is arranged between the imaging lens 11 and the photo and pressure sensitive recording sheet 2 to record an image of the continuous tone on the original 7 onto the recording sheet 2, the halftone screen 31 is located at an operative position spaced the predetermined distance apart from the recording sheet 2 on the exposure platen 5 as indicated by the solid line in FIG. 8. On the other hand, when the image of a dot tone on the original 7 is recorded onto the recording sheet 2, the halftone screen 31 is located at an inoperative position spaced apart from the recording sheet 2 a distance longer than the predetermined distance, as indicated by the phantom line in FIG. 8.

By doing so, like the previously mentioned embodiment, it is possible also for the modification that when the image of the continuous tone on the original 7 is recorded, an image high in gradation can be formed on the recording sheet 2, while when the image of the dot tone on the original 7 is recorded, a sharp image can be formed on the recording sheet 2 without occurrence of interference fringes.

Figure 11:
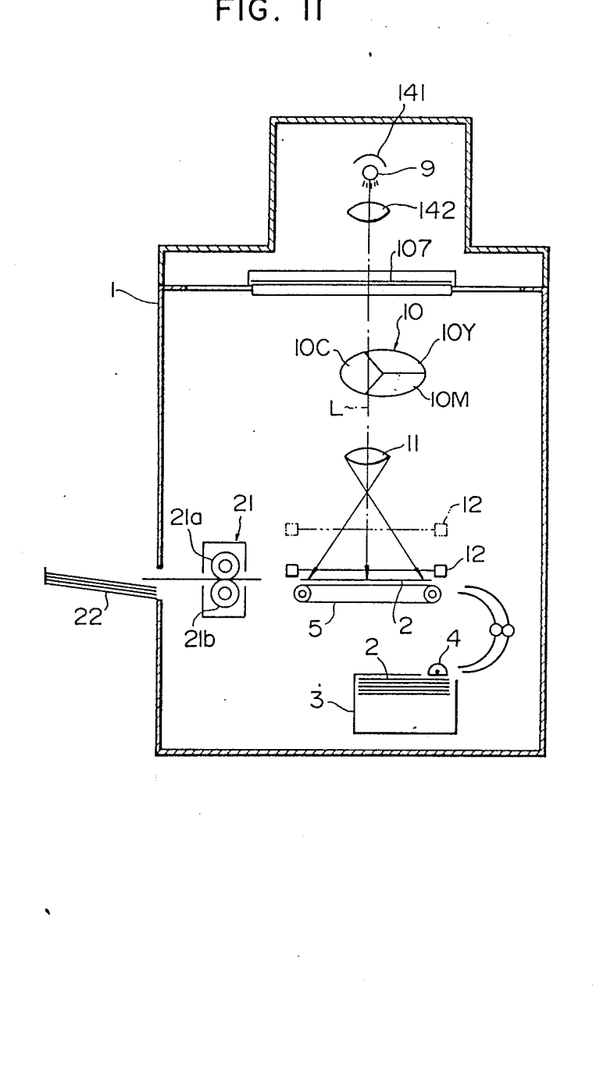
FIG. 11 is a schematic structural view of another modification of the apparatus.
Figure 12:
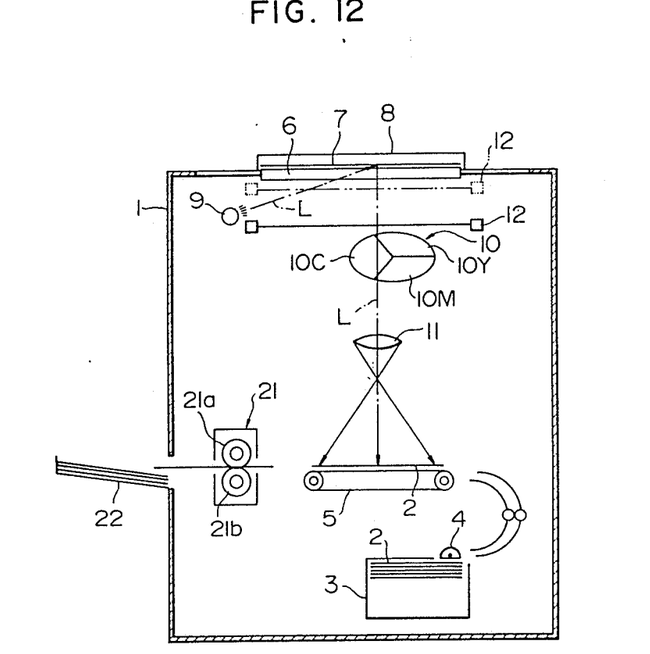
FIG. 12 is a schematic structural view of still another modification of the apparatus.

FIGS. 11 and 12 show respectively another and still another modifications of the image recording apparatus according to the invention. In FIGS. 11 and 12, components and parts like or similar to those of the embodiment illustrated in FIGS. 1 through 7 are designated by like or similar reference numerals, and the detailed description of such like or similar components and parts will therefore be omitted for simplification.

The modification illustrated in FIG. 11 employs a transmitted-light exposure system, in substitution for the reflected-light exposure system of the embodiment illustrated in FIG. 1 in which the light is applied to the original 7 and the recording sheet 2 is exposed to the light reflected from the original 7. Specifically, in the modification shown in FIG. 11, a reflector 141 is provided for reflecting the light from the lamp 9 toward a condenser lens 142. A transparent original 107 such as a slide is illuminated with the light passing through the condenser lens 142. The light is transmitted through the transparent original 107 and passes along the predetermined optical path L. The recording sheet 2 is exposed to the light transmitted through the transparent original 107.

In the modification illustrated in FIG. 12, the halftone screen 12 is arranged between the lamp 9 and the original 7, unlike the embodiment shown in FIG. 1 in which the halftone screen 12 is arranged between the imaging lens 11 and the recording sheet 2 on the exposure platen 5. The operative position of the halftone screen 12 in the modification of FIG. 12 is located remote from the original 7 on the original platen 6, while the inoperative position of the halftone screen 12 is located adjacent the original 7. It is needless to say that the halftone screen 13 shown in FIG. 8 can be substituted for the halftone screen 12 illustrated in FIG. 12.

Figure 10:
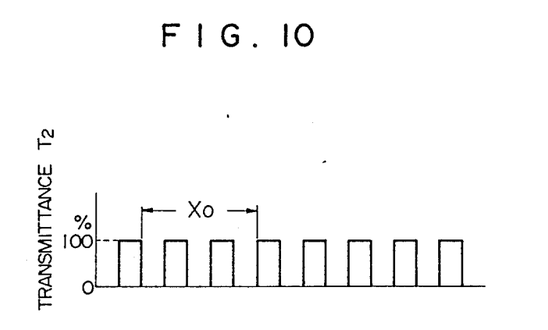
FIG. 10 is a graphical representation of a transmittance of the halftone screen along line X—X in FIG. 9.

It is possible for the modifications illustrated respectively in FIGS. 11 and 12 to obtain functional advantages similar to those achieved by the embodiment shown in FIGS. 1 through 7 and the modification shown in FIGS. 8 through 10.

It is to be understood that the invention is not limited to the above-described specific forms, but various changes and variations can be made to the invention. For example, each dot on the halftone screen 12 may be in the form of a circle, a rhomboid or the like, other than the square. The halftone screen 12 may have dots different in size or distribution density from the illustrated ones. Furthermore, the spacing between each pair of adjacent black lines and the intersecting angle between the first and second groups of black lines on the halftone screen 31 may suitably be modified. Further, in order to prevent interference between the dots corresponding to the respective colors, the halftone screen 12 or 31 may be so arranged as to be angularly moved in the horizontal plane intermittently by a minute angle. Moreover, separate-type photo and pressure sensitive recording sheets may be employed, in which each photo and pressure sensitive recording sheet has coated thereon with only the microcapsules 2C, 2M and 2Y corresponding to the respective colors, while a developing agent is coated on each separate transfer sheet. Further, in place of the photo-curable resin, each of the microcapsules coated on the recording sheet 2 may contain a resin capable of being photo-softened such that the microcapsules are photo-softened at exposure. In this case, it is required to employ a three-color separating filter which selectively absorbs only a light of wavelengths photo-softening the microcapsules. Photo and heat sensitive recording sheets, silver chloride photographing sheets or other photo-sensitive recording sheets may be used in substitution for the photo and pressure sensitive recording sheets 2. A continuous roll of photo and pressure sensitive web may be employed in substitution for the cut recording sheets 2. Further, the photo and pressure sensitive recording sheet may be coated with microcapsules which contain only one of individual dye precursors for black, yellow, magenta and cyan to provide a single-color image recording apparatus. Furthermore, the color-separating filter 10 may have a fourth sectoral filter section which allows passage of a light having wavelengths sensible by all the microcapsules 2C, 2M and 2Y on the photo and pressure sensitive recording sheet 2. In this case, when the image of the continuous tone on the original 7 is recorded, the halftone screen 12 is once located at the inoperative position to expose the recording sheet 2 to the light, thereby shortening a period of time for the pre-exposure until the microcapsules 2C, 2M and 2Y initiate photo-curing, or thereby improving the gradation reproducibility of the highlight portions of the original 7.

What is claimed is:

1. An apparatus for recording an image on an original onto a photo-sensitive recording medium high in gamma value, which comprises:

light source means for emitting a light with which said original is illuminated, the light from said light source means passing along a predetermined optical path extending between said light source means and said photo-sensitive recording medium;

an optical system arranged on said predetermined optical path for exposing said photo-sensitive recording medium to the light from said original to form an image on said photo-sensitive recording medium, which image corresponds to the image on said original;

halftone screen means having its light transmittance varying regularly, said halftone screen means being arranged on said optical path for movement therealong with respect to said photo-sensitive recording medium between an operative position where a screening effect of said halftone screen means is validated and an inoperative position where the screening effect of said halftone screen means is invalidated;

moving means for moving said halftone screen means between said operative and inoperative positions; and control means for controlling said moving means in such a manner that when the image on the original is of a continuous tone, said moving means moves said halftone screen means to said operative position, while when the image on the original is of a dot tone, said moving means moves said halftone screen means to said inoperative position.

2. The apparatus according to claim 1, wherein said halftone screen means has the light transmittance which varies continuously in the form of a sinusoidal wave, and wherein said operative position is located in close relation to said photosensitive recording medium, while said inoperative position is located apart from said photo-sensitive recording medium.

3. The apparatus according to claim 2, wherein said halftone screen means is comprised of a contact screen in which a multiplicity of dots are arranged in the form of a checkered pattern.

4. The apparatus according to claim 1, wherein said halftone screen means has the light transmittance which varies continuously in the form of a rectangular wave, and wherein said operative position is located a predetermined distance apart from said photo-sensitive recording medium, while said inoperative position is located apart from said photo-sensitive recording medium a distance longer than said predetermined distance.

5. The apparatus according to claim 4, wherein said halftone screen means is comprised of a glass screen in which a first group of a multiplicity of black lines extend in spaced parallel relation to each other and a second group of multiplicity of black lines extend in spaced parallel relation to each other, said first group of black lines being intersected with said second group of black lines.

6. The apparatus according to claim 1, wherein said halftone screen means is arranged between said light source means and said optical system, and wherein said operative position is located remote from said original, while said inoperative position is located adjacent said original.

7. The apparatus according to claim 1, wherein the light from said light source means is reflected by said original such that the reflected light is directed toward said photo-sensitive recording medium.

8. The apparatus according to claim 1, wherein the light from said light source means is transmitted through said original such that the transmitted light is directed toward said photo-sensitive recording medium.

9. The apparatus according to claim 1, wherein said moving means comprises a motor drivingly connected to said halftone screen means, and wherein said control means comprises switch means electrically connected to said motor, said switch means being selectively movable between a continuous-tone position and a dot-tone position, the arrangement being such that said motor is operative in response to movement of said switch means to said continuous-tone position to move said halftone screen means to said operative position, and is operative in response to movement of said switch means to said dot-tone position to move said halftone screen means to said inoperative position.

10. The apparatus according to claim 1, wherein the image formed on said photo-sensitive recording medium by said optical system is a latent image, and wherein said apparatus further comprises developing means for developing the latent image on said photo-sensitive recording medium.

11. The apparatus according to claim 10, wherein said optical system includes a color-separating filter arranged between said original and said photo-sensitive recording medium, said color-separating filter being composed of at least three filter sections including a red filter section, a green filter section and a blue filter section.

12. The apparatus according to claim 11, wherein said photo-sensitive recording medium is also sensitive to pressure and is composed of a transparent resinous substrate and microcapsules coated on one side of said substrate, said microcapsules containing their respective dye precursors, said dye precursors including cyan dye precursors, magenta dye precursors and yellow dye precursors, and wherein said developing means comprises a pair of pressure-developing rollers, said photo and pressure sensitive recording medium carrying thereon the latent image being adapted to pass through a nip between said pressure-developing rollers so that the latent image is developed under pressure due to said pressure-developing rollers.

* * * * *